United States Patent
Aoki et al.

(10) Patent No.: US 10,608,198 B2
(45) Date of Patent: Mar. 31, 2020

(54) LIGHT-EMITTING DEVICE

(71) Applicants: PIONEER CORPORATION, Tokyo (JP); TOHOKU PIONEER CORPORATION, Yamagata (JP)

(72) Inventors: Kenji Aoki, Yonezawa (JP); Norikazu Mito, Yonezawa (JP); Toshinao Yuki, Yonezawa (JP)

(73) Assignee: PIONEER CORPORATION/TOHOKU PIONEER CORPORATION, Tokyo (JP)

( * ) Notice: Subject to any disclaimer, the term of this patent is extended or adjusted under 35 U.S.C. 154(b) by 18 days.

(21) Appl. No.: 15/557,071

(22) PCT Filed: Mar. 9, 2015

(86) PCT No.: PCT/JP2015/056864
§ 371 (c)(1),
(2) Date: Sep. 8, 2017

(87) PCT Pub. No.: WO2016/143045
PCT Pub. Date: Sep. 15, 2016

(65) Prior Publication Data
US 2018/0069189 A1  Mar. 8, 2018

(51) Int. Cl.
*H01L 27/32* (2006.01)
*H01L 51/52* (2006.01)
(Continued)

(52) U.S. Cl.
CPC ...... *H01L 51/5203* (2013.01); *H01L 27/3244* (2013.01); *H01L 51/5012* (2013.01);
(Continued)

(58) Field of Classification Search
CPC .................................................. H01L 27/326
See application file for complete search history.

(56) References Cited

U.S. PATENT DOCUMENTS 8,963,414 B2  2/2015  Sawabe et al.
8,963,815 B2  2/2015  Park
(Continued)

FOREIGN PATENT DOCUMENTS

CN  103219359 A  7/2013
JP  2010-230797 A  10/2010
(Continued)

OTHER PUBLICATIONS

Tamaki EPO translation, JP 2012-221811, Nov. 12, 2012.*
(Continued)

*Primary Examiner* — Peniel M Gumedzoe
*Assistant Examiner* — Christopher A Johnson
(74) *Attorney, Agent, or Firm* — Procopio, Cory, Hargreaves & Savitch LLP

(57) ABSTRACT

A substrate (100) transmits visible light. Plural light-emitting regions (142) are located on the substrate (100) and are aligned in a first direction. A non-light-emitting region (144) is provided in each area between the plural light-emitting regions (142) and transmits visible light. Moreover, the light-emitting region (142) includes plural light-emitting units (140). The light-emitting units (140) are aligned in the first direction. In addition, each light-emitting unit (140) includes a first electrode (110), an organic layer (120), and a second electrode (130). The organic layer (120) is formed between the first electrode (110) and the second electrode (130).

7 Claims, 4 Drawing Sheets

(51) Int. Cl.
*H01L 51/50* (2006.01)
*H05B 33/08* (2020.01)
*H01L 51/00* (2006.01)

(52) U.S. Cl.
CPC ..... *H01L 51/5253* (2013.01); *H05B 33/0896* (2013.01); *H01L 27/3204* (2013.01); *H01L 27/3211* (2013.01); *H01L 51/0097* (2013.01); *H01L 2227/326* (2013.01); *H01L 2251/5307* (2013.01); *H01L 2251/5338* (2013.01); *H01L 2251/5361* (2013.01); *H01L 2251/558* (2013.01)

(56) References Cited

U.S. PATENT DOCUMENTS

| | | | |
|---|---|---|---|
| 9,136,440 | B2 | 9/2015 | Yim et al. |
| 9,450,201 | B2 | 9/2016 | Yim et al. |
| 2009/0201229 | A1* | 8/2009 | Kobayashi .......... H01L 27/3213 345/76 |
| 2011/0220899 | A1 | 9/2011 | Park et al. |
| 2012/0280894 | A1 | 11/2012 | Park |
| 2013/0182418 | A1 | 7/2013 | Sawabe et al. |
| 2013/0328022 | A1 | 12/2013 | Choi et al. |
| 2014/0291637 | A1* | 10/2014 | Yim .................. H01L 27/3244 257/40 |
| 2015/0194638 | A1 | 7/2015 | Choi et al. |
| 2015/0214280 | A1* | 7/2015 | Furuie ................ H01L 27/3218 257/89 |
| 2015/0249115 | A1 | 9/2015 | Chen et al. |
| 2015/0340650 | A1 | 11/2015 | Kakizoe et al. |
| 2015/0380687 | A1 | 12/2015 | Yim et al. |
| 2017/0005157 | A1 | 1/2017 | Yim et al. |
| 2017/0077404 | A1 | 3/2017 | Park et al. |

FOREIGN PATENT DOCUMENTS

| | | |
|---|---|---|
| JP | 2011-187431 A | 9/2011 |
| JP | 2012-221811 A | 11/2012 |
| JP | 2012-234798 A | 11/2012 |
| JP | 2013-149376 A | 8/2013 |
| JP | 2013-258144 A | 12/2013 |
| JP | 2014-154211 A | 8/2014 |
| JP | 2014-199812 A | 10/2014 |

OTHER PUBLICATIONS

International Search Report and Written Opinion for PCT App No. PCT/JP2015/056864 dated May 12, 2015, 9 pgs.
Office Action for related JP App. No. JP 2018-237134 dated Nov. 5, 2019, 4 pages.

* cited by examiner

LIGHT-EMITTING DEVICE

CROSS-REFERENCE TO RELATED APPLICATIONS

This application is a U.S. National Stage entry of PCT Application No. PCT/JP2015/056864, filed on Mar. 9, 2015. The contents of the foregoing are incorporated by reference.

TECHNICAL FIELD

The present invention relates to a light-emitting device.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a transparent material is used for the first electrode, and a metal material is used for the second electrode.

There is a case where transmittance of light from the outside (optical transparency) is required in the light-emitting device using the organic EL. For example, Patent Document 1 discloses making the second electrode linear in order to provide a display device using an organic EL with optical transparency. In this way, a portion where the second electrode is provided emits light, and a portion where the second electrode is not provided transmits light from the outside.

In addition, Patent Document 2 discloses providing a region transmitting light from the outside next to a pixel in the display device using the organic EL. In more detail, plural pixels are aligned in a first direction. In addition, the region which transmits light from the outside is provided next to each of the plural pixels.

RELATED ART DOCUMENTS

Patent Documents

[Patent Document 1]: Japanese Unexamined Patent Application Publication No. 2013-149376
[Patent Document 2]: Japanese Unexamined Patent Application Publication No. 2012-234798

SUMMARY OF THE INVENTION

In order to provide a light-emitting device using an organic EL with optical transparency, a region transmitting light from the outside may be provided in the light-emitting device, as described in Patent Documents 1 and 2. However, since no light-emitting unit is formed in this region, a percentage of the region where the light-emitting unit is formed out of the light-emitting device (an area efficiency) may decrease.

An example of the problem to be solved by the present invention is to prevent the area efficiency of a light-emitting device from decreasing, while providing the light-emitting device with the optical transparency.

Means for Solving the Problem

The invention described in claim 1 is a light-emitting device including:

a substrate transmitting visible light;
plural light-emitting regions located on the substrate and aligned in a first direction; and
a non-light-emitting region located between the plural light-emitting regions,
in which the non-light-emitting region transmits visible light,
in which the light-emitting region includes plural light-emitting units aligned in the first direction, and
in which the light-emitting unit includes a first electrode, a second electrode, and an organic layer located between the first electrode and the second electrode.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENT

Figure 1:
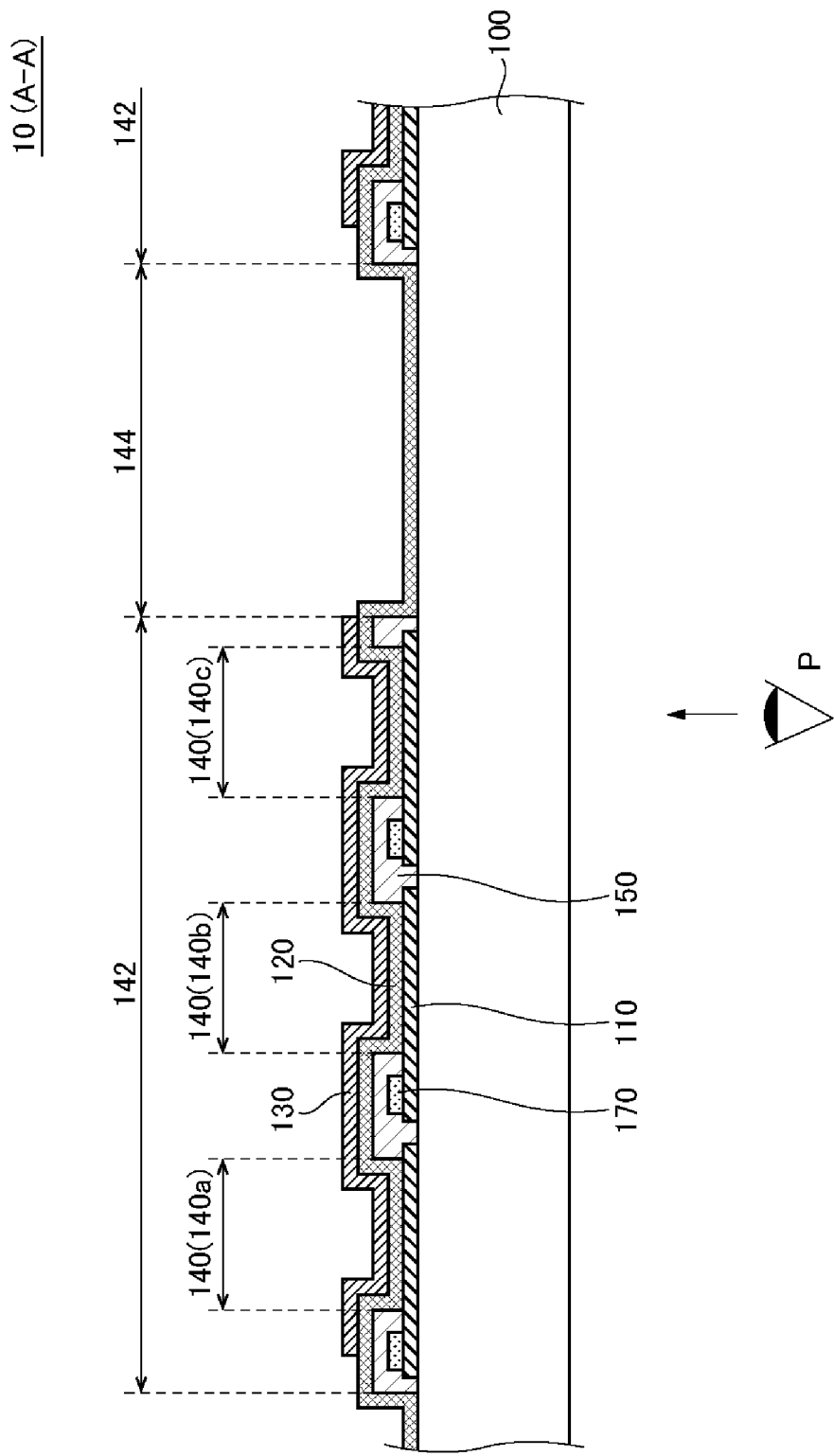
FIG. 1 is a cross-sectional view illustrating a light emitting device according to an embodiment.

An embodiment of the present invention will be described below by referring to the drawings. Moreover, in all the drawings, the same constituent elements are given the same reference numerals, and descriptions thereof will not be repeated.

FIG. 1 is a cross-sectional view illustrating a configuration of a light-emitting device 10 according to an embodiment. The light-emitting device 10 according to the embodiment includes a substrate 100, plural light-emitting regions 142, and a non-light-emitting region 144. The substrate 100 transmits visible light. The plural light-emitting regions 142 are provided on the substrate 100, and aligned in the first direction (in the vertical direction in FIG. 1). The non-light-emitting region 144 is disposed in respective intervals between the plural light-emitting regions 142 and transmits light. In addition, the light-emitting region 142 includes plural light-emitting units 140. The light-emitting units 140 are aligned in the first direction. Further, each light-emitting unit 140 includes a first electrode 110, an organic layer 120, and a second electrode 130. The organic layer 120 is located between the first electrode 110 and the second electrode 130. A detailed description will be provided below.

The light-emitting device 10 is a so-called bottom-emission type illumination device, in which light emitted from the organic layer 120 is extracted through the substrate 100. The substrate 100 is, for example, a glass substrate or a resin substrate, through which visible light passes. In addition, the substrate 100 may have flexibility. In this case, the light-emitting device 10 may be used with the substrate 100 in a curved state. In a case where the substrate has flexibility, the thickness of the substrate 100 is, for example, equal to or greater than 10 μm and equal to or less than 1,000 μm. When providing the glass substrate with flexibility, the thickness of the glass substrate is preferably equal to or less than 300 μm. The substrate 100 is polygonal such as, for example, rectangular. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of $SiN_x$, SiON or the like is formed at least on one surface of the substrate 100 on which the organic layer 120 is formed (preferably on both surfaces) in order to prevent moisture from transmitting through the substrate 100. Meanwhile, a planarization layer (for example, an organic layer) may be provided between the inorganic barrier film and the substrate 100.

The light-emitting region 142 is repeatedly provided along the first direction on the substrate 100. Each of the plural light-emitting regions 142 includes the plural light-emitting units 140. The light-emitting unit 140 is configured by laminating the first electrode 110, the organic layer 120, and the second electrode 130 in this order.

The first electrode 110 is a transparent electrode having optical transparency. A material of the transparent electrode is a material including a metal, for example, a metal oxide such as an indium tin oxide (ITO), an indium zinc oxide (IZO), an indium tungsten zinc oxide (IWZO), or a zinc oxide (ZnO). The thickness of the first electrode 110 is, for example, equal to or greater than 10 nm and equal to or less than 500 nm. The first electrode 110 is formed by, for example, sputtering or vapor deposition. Meanwhile, the first electrode 110 may be a conductive organic material such as a carbon nanotube or PEDOT/PSS.

The organic layer 120 includes a light-emitting layer. The organic layer 120 is configured by laminating, for example, a hole injection layer, a light-emitting layer, and an electron injection layer in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed by vapor deposition. Further, all layers of the organic layer 120 may be formed by coating.

The second electrode 130 includes a metal layer constituted of a metal selected from a first group including materials through which visible light does not pass, for example, Al, Au, Ag, Pt, Mg, Sn, Zn, and In, or an alloy of metals selected from the first group. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition using a mask.

Meanwhile, in the example illustrated in FIG. 1, the second electrodes 130 of the light-emitting unit 140 which belong to the same the light-emitting region 142 are connected to each other. In other words, a second electrode 130 is provided for each light-emitting region 142. This is to lower a wiring resistance of the light-emitting device 10. However, the second electrode 130 may be individually provided for each light-emitting unit 140.

Moreover, a conductive portion 170 is formed on the first electrode 110. The conductive portion 170 is, for example, an auxiliary electrode of the first electrode 110 and is in contact with the first electrode 110. The conductive portion 170 is formed of a material having a lower resistance value than that of the first electrode 110, and is formed using, for example, at least one metal layer. The conductive portion 170 has, for example, a configuration in which a first metal layer of Mo, a Mo alloy or the like, a second metal layer of Al, an Al alloy or the like, and a third metal layer of Mo, a Mo alloy or the like are laminated in this order. The second metal layer out of these three metal layers is the thickest. The conductive portion 170 is covered by an insulating layer 150. For this reason, the conductive portion 170 is not directly connected to any of the organic layer 120 and the second electrode 130.

The light-emitting units 140 which belong to the same light-emitting region 142 emit light of colors different from each other. For example, in the example illustrated in FIG. 1, three light-emitting units 140 (light-emitting unit 140a, 140b, 140c) are provided in the single light-emitting region 142. The light-emitting unit 140a emits, for example, blue light, the light-emitting unit 140b emits, for example, green light, and the light-emitting unit 140c emits, for example, red light. However, the light-emitting units 140 which belong to the same light-emitting region 142 may emit light of the same color.

An edge of the first electrode 110 is covered by the insulating layer 150. The insulating layer 150 is formed of a photosensitive resin material such as, for example, polyimide, and surrounds a portion of the first electrode 110, the portion serving as the light-emitting unit 140. By providing the insulating layer 150, it is possible to prevent the first electrode 110 and the second electrode 130 from being short-circuited at the edge of the first electrode 110. In the example illustrated in FIG. 1, an interval between the first electrodes 110 located next to each other is, for example, equal to or greater than 30 μm and equal to or less than 300 μm. For this reason, a space between the first electrodes 110 located next to each other is filled with the insulator layer 150. The insulating layer 150 is formed, for example, by applying a resin material serving as the insulating layer 150, and then exposing and developing the resin material.

The non-light-emitting region 144 is located between plural light-emitting regions 142. The non-light-emitting region 144 is a region in which the light-emitting unit 140 and the insulator layer 150 are not located, and transmits visible light. Meanwhile, in the example illustrated in FIG. 1, the first electrode 110 and the second electrode 130 are not provided in the non-light-emitting region 144 while the organic layer 120 is provided in the non-light-emitting region 144.

The width of the non-light-emitting region 144 is larger than any of the widths of the light-emitting units 140 and the intervals between the light-emitting units 140 located next to each other, and is, for example, equal to or greater than 350 μm and equal to or less than 1,000 μm. Meanwhile, the width of the non-light-emitting region 144 may be defined as a distance, for example, from an end of the insulator layer 150 provided in a certain light-emitting region 142, to an end of the insulator layer 150 provided in a light-emitting region 142 located next to the certain light-emitting region 142.

Figure 2:
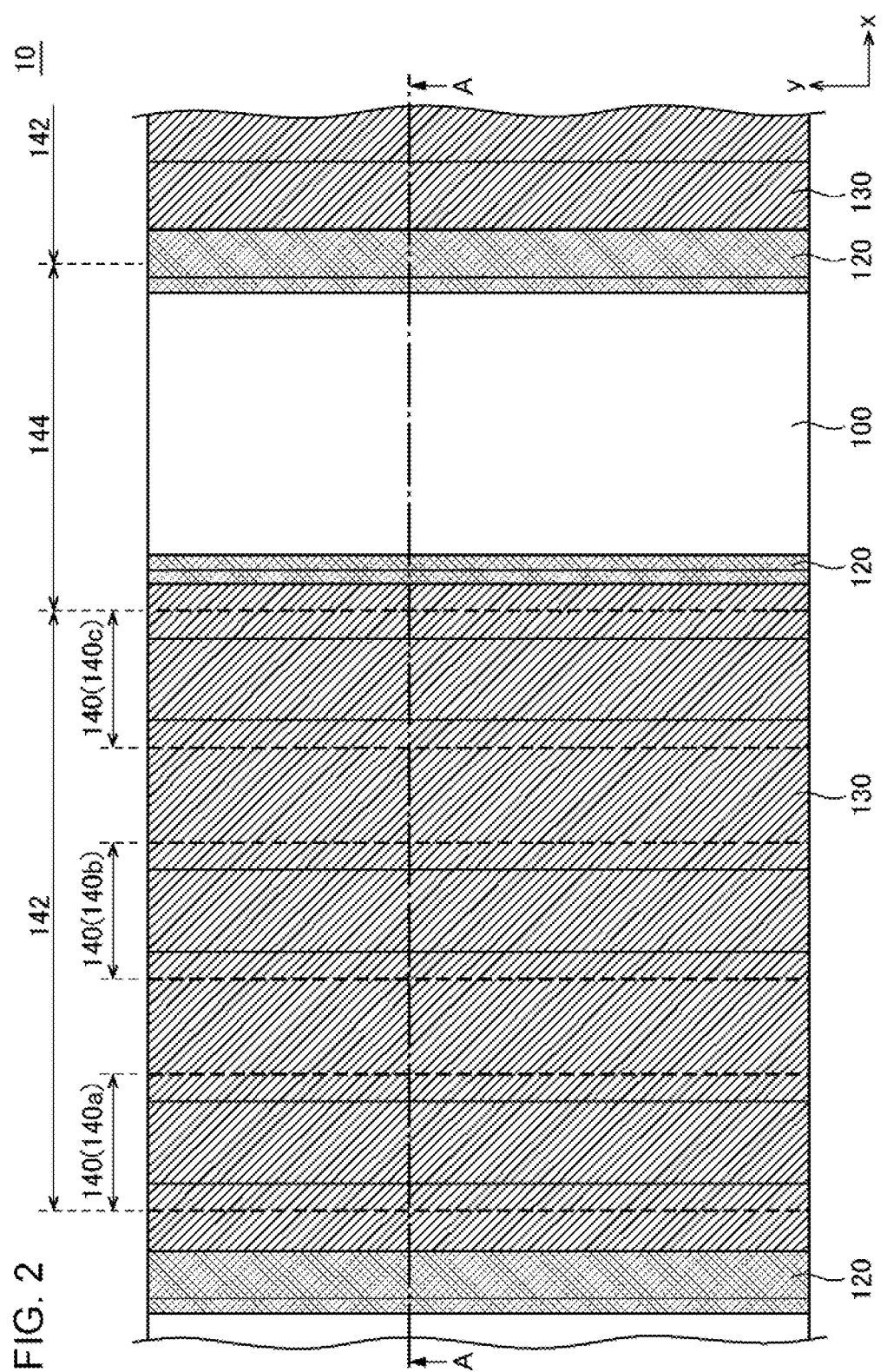
FIG. 2 is a plan view of the light emitting device.

FIG. 2 is a plan view of the light-emitting device 10. Meanwhile, FIG. 1 corresponds with a cross-sectional view taken along line A-A of FIG. 2. In the example shown in FIG. 2, the light-emitting unit 140, the light-emitting region 142, and the non-light-emitting region 144 extend linearly (in a y direction in FIG. 2). The light-emitting region 142 and the non-light-emitting region 144 are alternately repeatedly provided in a direction (x direction in FIG. 2) orthogonal to the extending direction of the light-emitting unit 140.

Meanwhile, the non-light-emitting region 144 is preferably provided in every region between the light-emitting units 142 next to each other. However, the light-transmitting region 144 is not required to be provided in every region between the light-emitting units 142.

Moreover, in the example illustrated in the FIG. 2, each of the light-emitting units 140 extends in a direction intersecting the first direction (for example, a direction orthogonal: y direction). In a cross section which extends parallel to the first direction (the cross section illustrated in FIG. 1), each width of the light-emitting unit 140a, 140b and 140c may be different from one another. A ratio of these widths may preferably be an inverse ratio of luminance of the each light-emitting unit 140 or a value close to the inverse ratio when the same voltage is applied. For example, the width of the light-emitting unit 140a which emits blue light is wider than the width the light-emitting unit 140b and the width of the light-emitting unit 140c both of which emit light of different colors. In this way, it is possible to inhibit the luminance of each color from varying in the light-emitting device 10. Meanwhile, the above mentioned width of the light-emitting unit 140 (that is, the width of a portion where the first electrode 110, the organic layer 120, and the second electrode 130 are overlapped) is, for example, equal to or greater than 150 µm and equal to or less than 400 µm.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. Then, the insulating layer 150 is formed over the edge of the first electrode 110. For example, in a case where the insulating layer 150 is formed of a photosensitive resin, the insulating layer 150 is formed in a predetermined pattern by undergoing exposure and development steps. Next, the organic layer 120 and the second electrode 130 are formed in this order. In a case where the organic layer 120 includes a layer which is formed by vapor deposition, the layer is formed in a predetermined pattern, for example, by using a mask or the like. Meanwhile, as illustrated in FIG. 1, in a case where the organic layer 120 is formed also in the non-light-emitting region 144, it is not necessary to pattern the organic layer 120, and thus manufacturing costs of the organic layer 120 may be reduced.

As stated above, according to the present embodiment, the non-light-emitting region 144 is provided between the light-emitting regions 142 next to each other. In other words, a single non-light-emitting region 144 is provided per plural light-emitting units 140. For this reason, the number of boundaries between the light-emitting units 140 and the non-light-emitting regions 144 is smaller compared to a case where the non-light-emitting region 144 is provided per each of plural light-emitting units 140, and thus it is possible to make the non-light-emitting region 144 wider, or make the light-emitting unit 140 wider.

Modification Example 1

Figure 3:
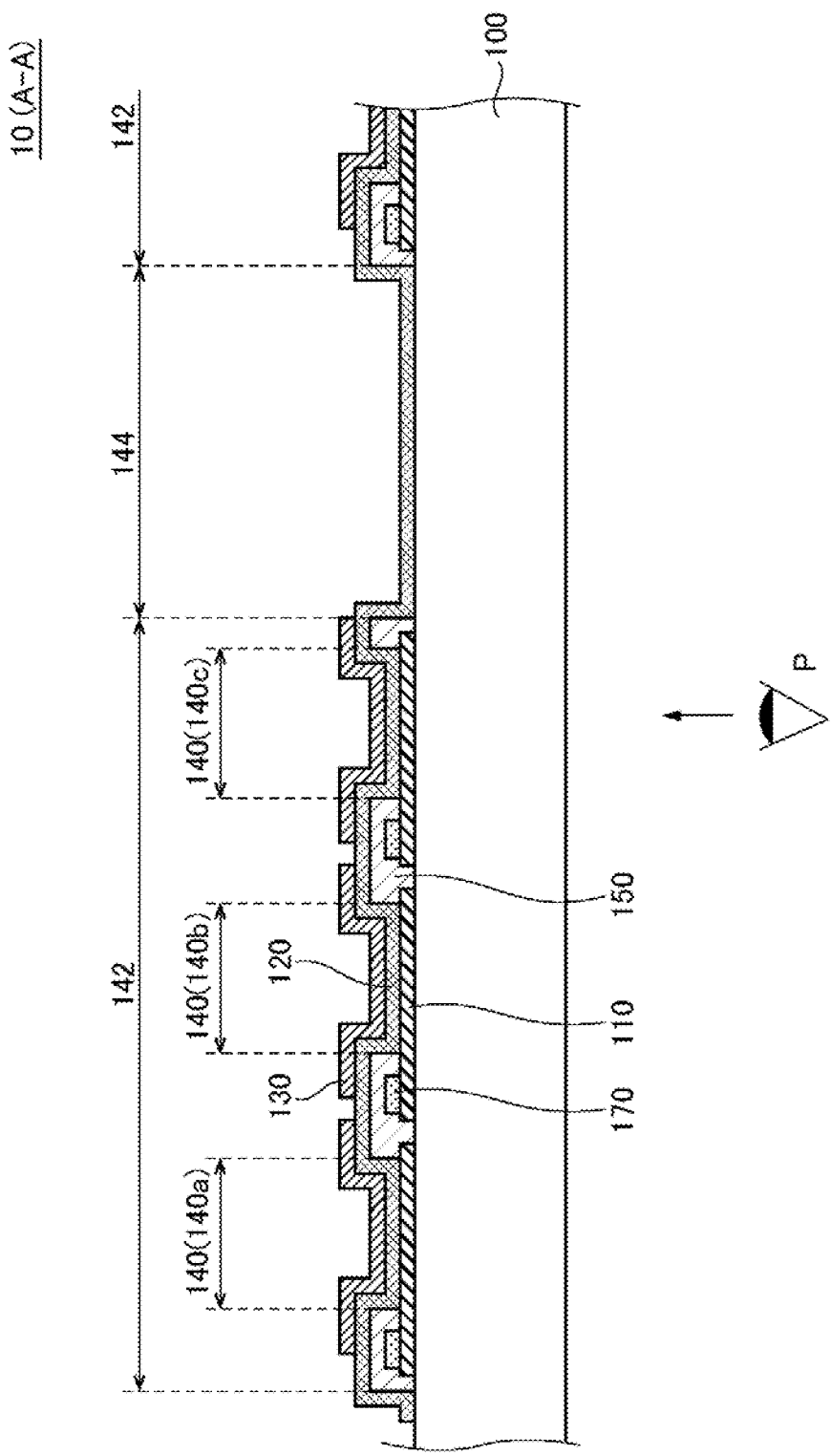
FIG. 3 is a cross-sectional view illustrating a configuration of the light emitting device according to Modification Example 1.

FIG. 3 is a cross-sectional view illustrating a light-emitting device 10 according to Modification Example 1, and corresponds to FIG. 1 in the embodiment. The light-emitting device 10 according to the present modification example has the same configuration as that of the light-emitting device 10 according to the embodiment, except that the second electrode 130 is provided for each light-emitting unit 140.

In the present modification example, as is the case with the embodiment, it is also possible to make the non-light-emitting region 144 wider, or make the light-emitting unit 140 wider compared to a case where the non-light-emitting region 144 is provided per each of plural light-emitting units 140.

Modification Example 2

Figure 4:
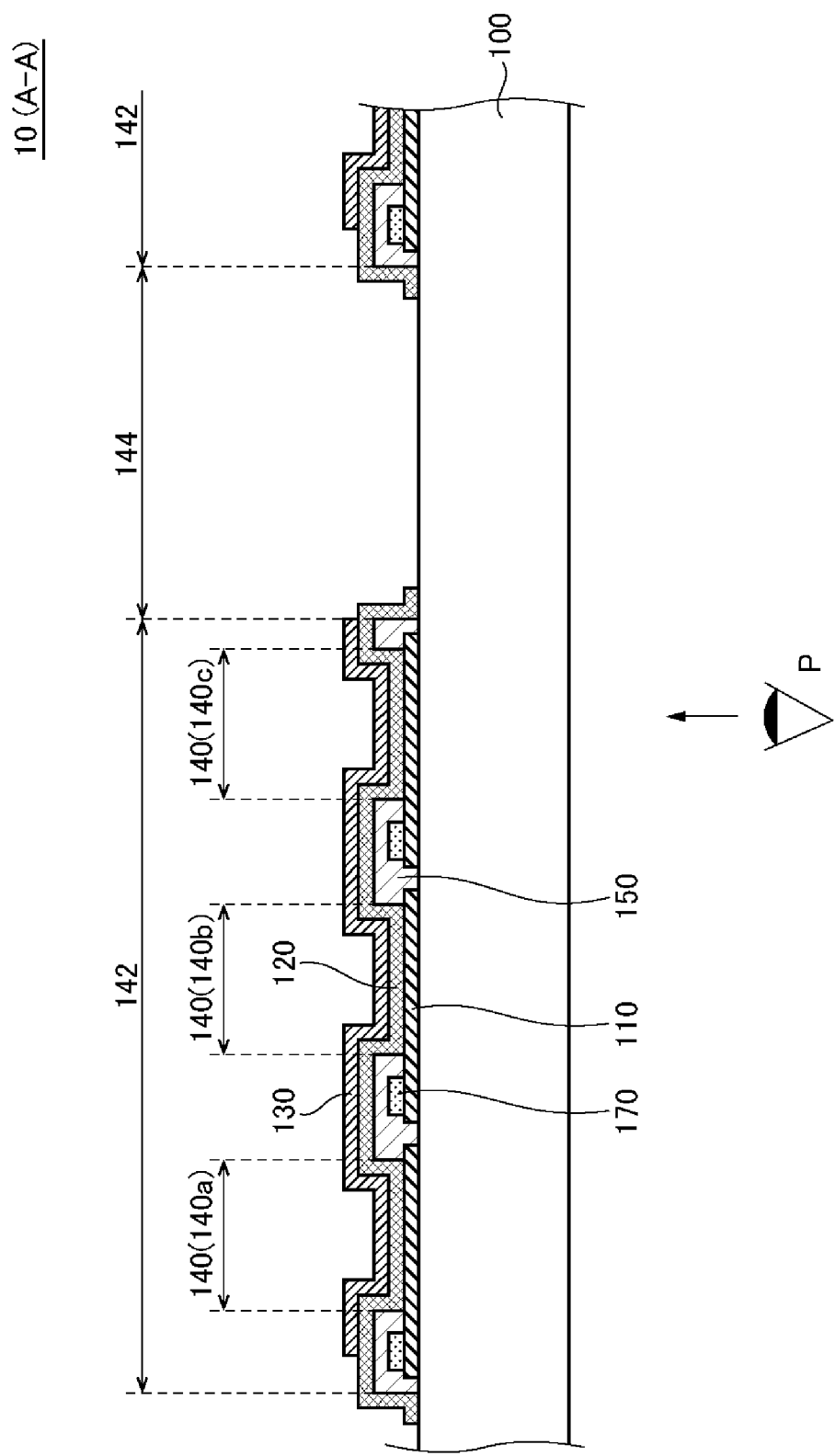
FIG. 4 is a cross-sectional view illustrating a configuration of the light emitting device according to Modification Example 2.

FIG. 4 is a cross-sectional view illustrating a light-emitting device 10 according to Modification Example 2. The light-emitting device 10 according to Modification Example 2 has the same configuration as that of the light-emitting device 10 according to the embodiment or Modification Example 1, except that no organic layer 120 is formed at least in a portion (for example, an entire portion) of the non-light-emitting region 144. FIG. 4 illustrates a case where the configuration is the same as that of the light-emitting device 10 according the embodiment.

In the present modification example, as is the case with the embodiment, it is also possible to make the non-light-emitting region 144 wider, or make the light-emitting unit 140 wider compared to a case where the non-light-emitting region 144 is provided per each of plural light-emitting units 140. Further, since no organic layer 120 is formed at least in a portion of the non-light-emitting region 144, a light transmittance of the non-light-emitting region 144 is improved.

The embodiment and the examples are described above referring to the drawings, but these are examples of the present invention and various configurations other than those described above can be employed.

The invention claimed is:

1. A light-emitting device comprising:
a substrate transmitting visible light;
a plurality of light-emitting regions located on the substrate and aligned in a first direction; and
a non-light-emitting region located between the plurality of light-emitting regions and aligned in the first direction,
wherein the non-light-emitting region transmits visible light,
wherein each light-emitting region includes a plurality of light-emitting units aligned in the first direction,
wherein each light-emitting unit includes a first electrode, a second electrode, and an organic layer located between the first electrode and the second electrode,
wherein an insulator layer covers an edge of the first electrode and is provided continuously between the plurality of light-emitting units located in a same light-emitting region,
wherein the insulator layer is not formed in the non-light-emitting region,
wherein respective luminescent colors of the plurality of light-emitting units belonging to a same light-emitting region are different from each other, and
wherein the second electrodes of the plurality of light-emitting units which belong to a same light-emitting region are connected to each other by a same material as a material of the second electrode.

2. The light-emitting device according to claim 1, wherein the first electrode and the second electrode are not provided in the non-light-emitting region.

3. The light-emitting device according to claim 2, wherein the non-light-emitting region includes the organic layer.

4. The light-emitting device according to claim 1, wherein a width of the non-light-emitting region is wider than a width of the light-emitting unit.

5. The light-emitting device according to claim 1, wherein the number of the plurality of light-emitting units belonging to a same light-emitting region is three.

6. The light-emitting device according to claim 1, wherein respective widths of the plurality of light-emitting units belonging to a same light-emitting region are different from one another.

7. The light-emitting device according to claim 1, wherein the second electrode does not pass visible light.

* * * * *